United States Patent [19]

Gluntz

[11] 3,997,228
[45] Dec. 14, 1976

[54] CONNECTOR FOR DIP

[75] Inventor: Glenn Harlan Gluntz, Harrisburg, Pa.

[73] Assignee: E. I. Du Pont de Nemours and Company, Wilmington, Del.

[22] Filed: Aug. 22, 1975

[21] Appl. No.: 606,780

[52] U.S. Cl. .................. 339/17 CF; 339/176 MP; 339/244 R
[51] Int. Cl.² .................................. H01R 13/50
[58] Field of Search ...... 339/17 CF, 176 R, 176 M, 339/176 MP, 244 R

[56] References Cited
UNITED STATES PATENTS

| | | | |
|---|---|---|---|
| 3,464,054 | 8/1969 | Mansfield | 339/176 MP |
| 3,474,394 | 10/1969 | Hammell | 339/176 R |
| 3,673,543 | 6/1972 | Garner | 339/17 CF |
| 3,821,693 | 6/1974 | Dechelette | 339/244 R |
| 3,918,784 | 11/1975 | Lemke | 339/17 CF |

Primary Examiner—Roy Lake
Assistant Examiner—Mark S. Bicks

[57] ABSTRACT

A connector for mounting DIP leads on pins extending from a circuit board includes an insulating body having a number of open sided recesses with a metal wall closing the sides of the recesses and folded cantilever springs extending from the walls into the interior of the recesses. Circuit board pins are seated in grooves in the bottom of the recesses from one side of the body and DIP leads are inserted into the recess from the opposite side of the body between the pins and springs so that the springs are stressed and hold the leads-in electrical connection against the pins.

4 Claims, 4 Drawing Figures

CONNECTOR FOR DIP

The invention relates to an improved connector for removably mounting dual in-line packages (DIP) on rows of pins extending from a circuit board.

Conventional DIP connectors include an insulating body having rows of passages spaced along adjacent rows of pins to permit the pins to enter the passages from one side of the connector and DIP leads to enter the passages from the other side of the connector. The lead and pin in each passage are held together by either an interference fit in the passage or by a spring integral with the connector body. The spring is stressed during insertion of the pin or lead into the passage and provides the required spring force to hold the two together in an electrical connection. Connectors of this type are disclosed in U.S. Pat. Nos.: 3,605,062, 3,611,269, and 3,673,543.

DIP connectors are conventionally used to mount a large number of DIPs on a single pin board. The industry requires that these connectors be reliable, assuring that a positive electrical connection is formed between each pin and a DIP lead. The connector must allow individual DIPs to be removed and remounted on the board with reliable connections formed between the leads and pins. In practice, there is no guarantee that all of the leads on a single DIP are exactly aligned for engagement with the pins extending from the circuit board. The connector must be able to receive and guide slightly misaligned leads into their proper passages.

Accordingly, the object of this invention is to provide an improved DIP connector for mounting DIPs on pins extending from a circuit board.

Another object of the invention is to provide such a connector which is economically manufactured and which forms a reliable connection between DIP leads and pins despite repeated removal and reinsertion of the DIP leads.

The connector of the invention includes an insulating body having an elongate member extending the length of the body with a series of spaced projections on one side of the member defining open sided cavities communicating the top and bottom of the body. The open sides of the cavities are closed by flat metal walls each including a folded cantilever spring extending into the cavity for biasing the lead against the pin. Beveled surfaces on the three sides of one end of the cavity defined by the insulating body and on the fourth side of the end defined by the spring cooperate to pilot individual leads into the cavities. The metal wall extends into slots to both sides of the cavity and is backed up by large area contacts with the plastic of the body to prevent creep of the plastic and resultant decrease of contact pressure in time. Large area standoffs space the body above the circuit board and support the body against tilting, particularly when the leads are inserted and withdrawn.

Other objects and features of the invention will become apparent as the description proceeds, especially when taken in conjunction with the accompanying drawing illustrating the invention, of which there is one sheet.

IN THE DRAWINGS

Figure 1:
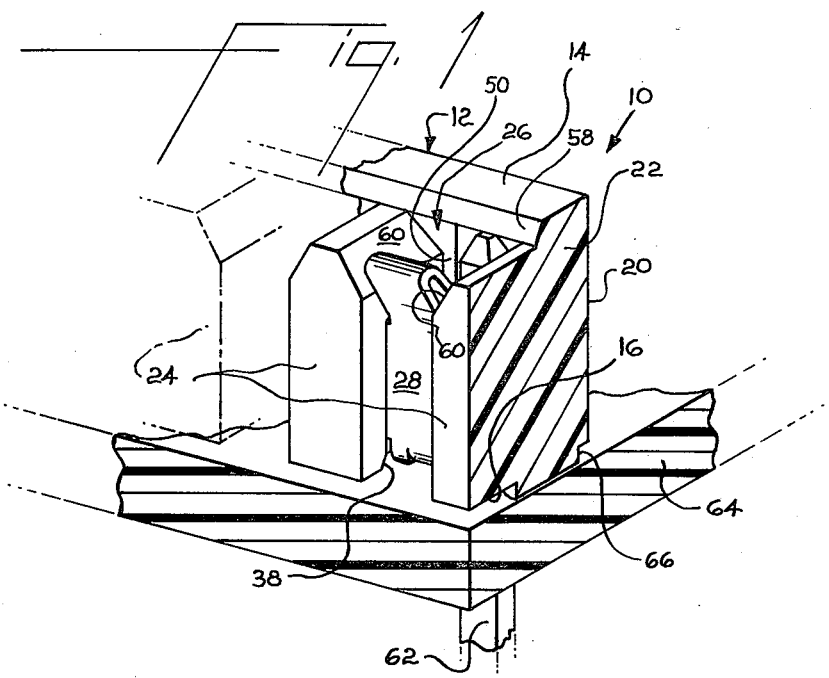
FIG. 1 is a perspective view, broken way, of a portion of an elongate connector according to the invention.

Connector 10 includes an elongate insulating body 12 having opposed top and bottom 14 and 16 and sides 18 and 20 all extending along the length of the body. Continuous body member 22 adjacent side 20 extends along the length of the body. Spaced projections 24 extend from member 22 to side 18 and define a series of recesses 26 extending between the top and bottom 14 and 16 and open on side 18.

Figures 3, 4:
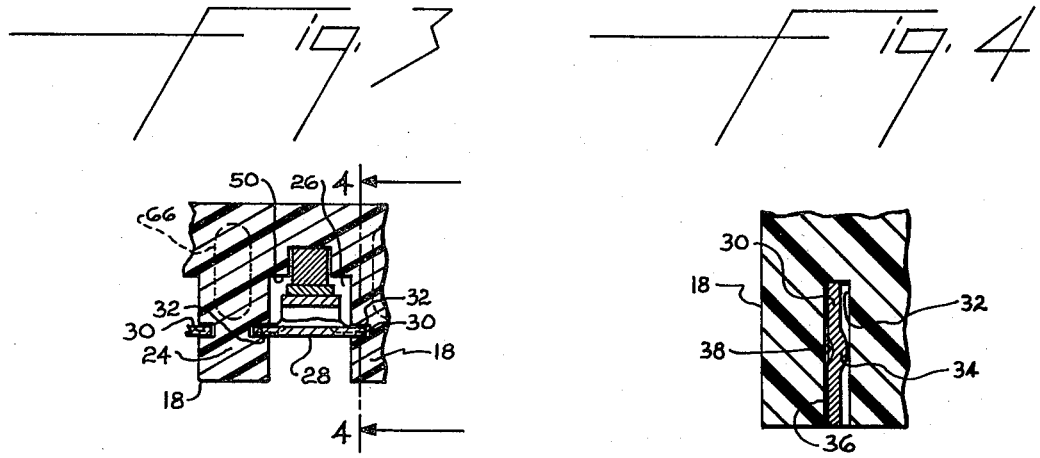
FIG. 3 is a sectional view taken along line 3—3 of FIG. 2.
FIG. 4 is a sectional view taken along line 4—4 of FIG. 3.

A flat wall 28 extends across each recess 26 adjacent wall 18 to close the open side of the recess. The edges 30 of walls 28 are fitted within slots 32 on the sides of the recess and include dimples 34 facing away from side 18. As illustrated in FIG. 4, the width of slot 32 is greater than the thickness of edges 30. The dimples 34 project outwardly from their respective edges so that during insertion of the walls into the slots, the dimples engage the sides of the slots away from side 18 in a friction fit between the wall and the body with the flat outer sides of the edges 36 flush upon the sides 38 of the slot adjacent side 18. The wall members 28 are inserted into recesses 26 through bottom surface 16 to move edges 30 into slots 32. Beveled lead-ins 39 are provided on the slots at surface 16 to facilitate piloting of the edges into the slots.

Figure 2:
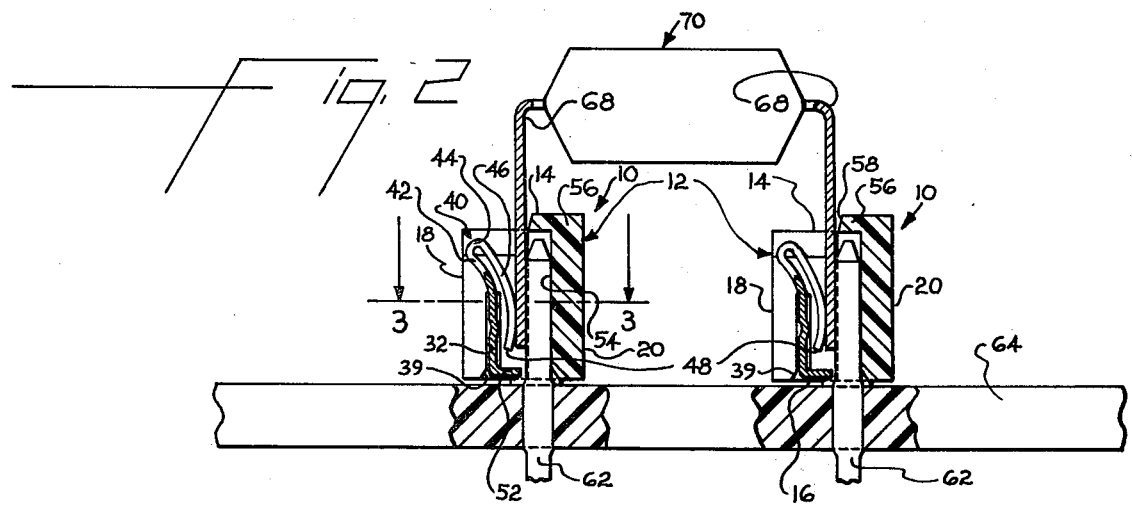
FIG. 2 is a sectional view illustrating the use of two connectors for forming electrical connections between DIP leads and circuit board pins.

A folded cantilever spring 40 extends from the upper edge of each wall 28 adjacent top 14 and includes a first beam 42, a reverse bend or bight portion 44 and a bowed beam 46 having a free end 48 located in recess 26 between the wall 28 and the recess wall 50 away from body side 18. As illustrated in FIG. 2, the first beam 42 extends above wall 28 and away from inner wall 50 of the recess. The 180° bight portion 44 is located at the outer end of beam 42 such that the end of the second beam 46 joining the bight portion is positioned further away from wall 50 than member 28. Beam 46 is bowed toward wall 50 as illustrated so that a lead inserted into the recess from top 14 engages the crest of the bow and collapses the spring to move the end of the second beam toward the wall 28 which acts as a stop to prevent over-stressing of the spring. As illustrated in FIG. 2, the spring 40 is within the sides of the insulating body 12 to reduce the possibility of injury or short circuits. The length of the folded spring 40 improves the deflection properties of the spring.

A lead-stop and pin-guide tab 52 on the bottom edge of wall 28 extends toward recess wall 50. The tab is in the path of insertion of a lead into recess 26 through top 14 and prevents over-insertion of the lead. The tab also closes part of the recess at bottom 16 to define a pin-receiving opening at the bottom. Pin receiving groove 54 extends along wall 50 from bottom 16 toward pin cover 56 at top 14.

Following insertion of the metal members 28 into the recesses 26 of the body 12, the connector 10 is mounted on a series of regularly spaced square circuit board pins 62 extending from circuit board 64. The pointed ends of the pins are piloted into the recesses 26 through the openings at bottom 16. The tabs 52 guide the pins into the pin receiving grooves 54. With the blocks fully mounted on the pins, the tapered ends of the pin are located below covers 56. As illustrated in FIGS. 2 and 3, the square pins 62 extend outwardly of recesses 54 beyond surface 50.

Standoffs 66 rest flush on the upper surface of board 64. The standoffs provide a stable support for the connector on the board and space the connector above the board. As illustrated in FIGS. 2 and 3, standoffs 66 are located between recesses 26 and extend laterally to either side of the pins 62 and leads 68 sufficiently to resolve moments exerted on the connector, particularly during insertion of leads, to prevent tipping of the connectors. The stability provided by the standoffs prevent bending of the pins.

In use a pair of connectors 10 is mounted on two rows of pins 62 spaced apart a distance equal to the spacing between leads 68 of dual in-line package 70. The leads are then moved into the recesses 26 by positioning the DIP above the pair of connectors 10 on board 64 with each lead above its respective recess 26. The DIP is then lowered toward the board to move each lead 68 into its recess. Beveled surfaces 58 and 60 on insulating block 12 and the outer surface of the second beam 46 of spring 40 define a large target for the lead and cooperate to guide slightly misaligned leads into their recesses. The beveled ends of the pins 62 which are exposed outside of the cover 56 assure that the sharp corners ends of the leads do not hang up on the pins during insertion.

With the leads properly aligned in their recesses further insertion moves the leads between the sides of the pins exposed outwardly of grooves 54 and the crests of bowed beams 46 so that springs 40 are collapsed toward members 28 to bias the leads against the pins and form electrical connections between the leads and the sides of the pins extending from grooves 54.

The collapse of the springs 40 bias flat sides 36 of the walls 28 against the walls 38 of slots 32 so that there are a large area contacts between the metal walls 28 and insulating body 12. Body 12 is preferably formed of a molded plastic material having a tendency to creep with time when subjected to low area high force contact. For instance, if dimples 34 faced side 18 and were forced against the sides of slots 32 by collapse of the spring 40, the plastic adjacent the dimples would in time be displaced allowing the dimples to move into the plastic and thus reducing the contact pressure for the electrical connection between the lead and the pin. Reduction of contact pressure is highly undesirable as it reduces the reliability of the connector and is avoided by facing the dimples toward the recess 26 so that they are not forced against the body.

As illustrated in FIG. 2, a pair of connectors 10 is used to form connections between the leads on each side of a DIP and two rows of circuit board pins. The connectors may be mounted on the pins with springs 40 on the same sides of the pins to form electrical connections with DIPs having leads spaced apart the same distance that the circuit board pins are spaced apart. The connectors can be mounted on the pins with the springs on the outsides or on the insides of the rows of pins to accomodate DIPs with leads spaced closer together or further apart than in DIP 70 shown in FIG. 2.

The insulating body 12 of connector 10 is easily molded by the use of a relatively simple mold and requires a reduced amount of plastic over conventional connectors used for mounting DIPs. There, the insulating bodies include bridging portions extending between the two rows of pin receiving cavities and walls. The springs for connector 10 are easily stamp-formed and inserted into the bodies. By use of a folded cantilever spring, the effective length of the spring is increased, resulting in improved spring properties. The folded cantilever spring is gradually compressed during insertion of the lead resulting in a lower insertion force for the DIP than if the lead extended directly from the wall into the recess.

While the connector 10 is disclosed primarily for use in joining DIP leads to circuit board pins, it may be used to join other types of circuit elements and accordingly is not limited to use with dual in-line packages.

While I have illustrated and described preferred embodiments of my invention, it is understood that these are capable of modification, and I therefore do not wish to be limited to the precise details set forth, but desire to avail myself of such changes and alterations as fall within the purview of the following claims.

I claim:

1. A connector for forming electrical connections between leads and pins extending from a circuit board or the like, said connector comprising an elongate insulating body having a member on one side of the body running the length of the body, a number of projections spaced along the member and extending from the member toward an opposite side of the body, the projections having opposed walls defining open sided recesses between adjacent projections extending across the body, each wall having a slot in each recess, and a metal wall closing each recess, each metal wall including edges seated in a pair of said slots, an integral spring extending into a recess and friction fit dimples on its inner surface, there being a dimple in each slot for frictionally securing the metal wall to the body, the outer surfaces of said metal walls being flat whereby, upon mounting of the connector on a series of circuit board pins so that the pins extend into the recesses from one side of the body, leads may be inserted into the recesses from the other side of the body between the pins and the springs to compress the springs and form electrical connections between the pins and leads with the flat surfaces of the metal walls held against projections within the slots.

2. A connector as in claim 1 including a standoff means located on the bottom of the body between the recesses, each running from a spring to the member.

3. A connector as in claim 1 including a pin-receiving groove in the member within each recess, and beveled lead-in surfaces to the groove and wherein each spring comprises a first beam joining a metal wall and extending therefrom away from both the member and the wall, a bight portion at the end of the first beam and an elongate bowed second beam extending from the bight portion back into the recess, said second beam including a lead-in surface forming a large area target for receiving a lead and guiding the lead to the recess between the spring and pin.

4. A connector for forming electrical connections between a pair of conductors comprising an insulating body having an open sided recess extending through said body, a pair of opposed slots in the body within the recess, a metal wall in the recess having edges in the slots to close the open side of the recess, friction fit dimples on the inner surface of the wall for frictionally securing the wall to the body, a folded cantilever spring extending from the wall away from the recess around a bight portion and back into the recess, and a groove formed in the body on the opposite side of the recess so that, upon insertion of a first conductor into the groove and a second conductor into the recess between the first conductor and the spring, the spring is compressed and holds the two conductors together in electrical connection.

* * * * *